(12) United States Patent
Liao et al.

(10) Patent No.: US 12,131,951 B2
(45) Date of Patent: Oct. 29, 2024

(54) SEMICONDUCTOR PACKAGING METHOD AND SEMICONDUCTOR STRUCTURE

(71) Applicant: CHANGXIN MEMORY TECHNOLOGIES, INC., Hefei (CN)

(72) Inventors: Chuxian Liao, Hefei (CN); Jie Liu, Hefei (CN); Jun He, Hefei (CN); Lixia Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 390 days.

(21) Appl. No.: 17/452,450

(22) Filed: Oct. 27, 2021

(65) Prior Publication Data

US 2022/0130726 A1 Apr. 28, 2022

Related U.S. Application Data

(63) Continuation of application No. PCT/CN2021/110939, filed on Aug. 5, 2021.

(30) Foreign Application Priority Data

Oct. 22, 2020 (CN) .......................... 202011137752.4

(51) Int. Cl.
*H01L 23/48* (2006.01)
*H01L 21/768* (2006.01)
(Continued)

(52) U.S. Cl.
CPC ...... *H01L 21/76898* (2013.01); *H01L 23/481* (2013.01); *H01L 23/53228* (2013.01); *H01L 24/94* (2013.01)

(58) Field of Classification Search
CPC ............ H01L 21/76898; H01L 23/481; H01L 23/53228; H01L 24/94; H01L 2224/05571;
(Continued)

(56) References Cited

U.S. PATENT DOCUMENTS 7,560,375 B2 7/2009 Filippi et al.
7,572,673 B2 8/2009 Chung et al.
(Continued)

FOREIGN PATENT DOCUMENTS

CN 1996565 A 7/2007
CN 102088012 A 6/2011
(Continued)

OTHER PUBLICATIONS

International Search Report cited in PCT/CN2021/110939 mailed Sep. 28, 2021, 9 pages.
(Continued)

*Primary Examiner* — Niki H Nguyen
(74) *Attorney, Agent, or Firm* — Kilpatrick Townsend & Stockton LLP

(57) ABSTRACT

Embodiments of the present disclosure propose a semiconductor packaging method and a semiconductor structure. The semiconductor packaging method includes: providing a substrate; forming a metal pad on the substrate, where there is a gap between a sidewall of the metal pad and the substrate; and connecting multiple metal pads on substrates to each other.

17 Claims, 12 Drawing Sheets

(51) Int. Cl.
*H01L 23/00* (2006.01)
*H01L 23/52* (2006.01)
*H01L 23/532* (2006.01)
*H01L 29/40* (2006.01)

(58) Field of Classification Search
CPC ......... H01L 2225/1058; H01L 27/1464; H01L 23/5226; H01L 2224/16; H01L 2224/05552; H01L 2224/05022; H01L 2224/05573; H01L 2924/3511; H01L 2924/3011; H01L 21/565; H01L 23/13; H01L 2224/11462; H01L 23/48; H01L 21/4857; H01L 24/82; H01L 2224/16237; H01L 2225/0651; H01L 2224/92244; H01L 2224/48137; H01L 25/0655; H01L 23/3171; H01L 2224/02331; H01L 2224/13; H01L 2225/06517; H01L 2224/05184; H01L 23/528; H01L 27/14685; H01L 2224/05008; H01L 33/0093; H01L 2224/45099; H01L 2924/09701; H01L 2224/03912; H01L 23/525; H01L 2224/8385; H01L 2224/81801; H01L 2224/13024; H01L 2924/0001; H01L 2924/13055; H01L 33/44; H01L 24/09; H01L 33/46; H01L 2224/48228; H01L 2224/1403

See application file for complete search history.

(56) References Cited

U.S. PATENT DOCUMENTS

| | | | |
|---|---|---|---|
| 9,398,689 | B2 | 7/2016 | Chang et al. |
| 10,833,119 | B2 | 11/2020 | Hsu et al. |
| 2014/0264948 | A1* | 9/2014 | Chou ................ H01L 23/53228 438/109 |
| 2015/0364434 | A1* | 12/2015 | Chen ...................... H01L 24/03 257/773 |
| 2019/0385963 | A1 | 12/2019 | Chen et al. |

FOREIGN PATENT DOCUMENTS

| | | |
|---|---|---|
| CN | 104810338 A | 7/2015 |
| CN | 106611755 A | 5/2017 |
| CN | 110164786 A | 8/2019 |

OTHER PUBLICATIONS

First Office Action cited in CN202011137752.4, mailed Feb. 21, 2023, 10 pages.

\* cited by examiner

SEMICONDUCTOR PACKAGING METHOD AND SEMICONDUCTOR STRUCTURE

CROSS-REFERENCE TO RELATED APPLICATIONS

This is a continuation of International Patent Application No. PCT/CN2021/110939, filed on Aug. 5, 2021, which claims the priority to Chinese Patent Application No. 202011137752.4, titled "SEMICONDUCTOR PACKAGING METHOD AND SEMICONDUCTOR STRUCTURE" and filed on Oct. 22, 2020. The entire contents of International Patent Application No. PCT/CN2021/110939 and Chinese Patent Application No. 202011137752.4 are incorporated herein by reference.

TECHNICAL FIELD

The present disclosure relates to the field of semiconductors and semiconductor packaging technologies.

BACKGROUND

When a hybrid bonding technology is used to bond wafers to each other, a metal pad has a higher thermal expansion coefficient than a dielectric layer on a surface of a wafer to be bonded, which leads to adhesion problems in the dielectric layer close to the metal pad.

SUMMARY

One aspect of embodiments of the present disclosure provides a semiconductor packaging method, including: providing a substrate; forming a metal pad on the substrate, where there is a gap between a sidewall of the metal pad and the substrate; and connecting multiple metal pads on substrates to each other.

Another aspect of the embodiments of the present disclosure provides a semiconductor structure, including: a substrate with a groove; a metal pad located in the groove; and a gap, where at least a part of the gap is located on a sidewall of the groove, and the gap at least partially separates the metal pad from the substrate.

BRIEF DESCRIPTION OF THE DRAWINGS

The preferred embodiments of the present disclosure are described in detail below with reference to the accompanying drawings to make the objectives, features, and advantages of the present disclosure more obvious. The drawings are merely exemplary illustrations of the present disclosure, and are not necessarily drawn to scale. Same reference numerals in the drawings always represent same or similar parts.

DETAILED DESCRIPTION

Figure 1:
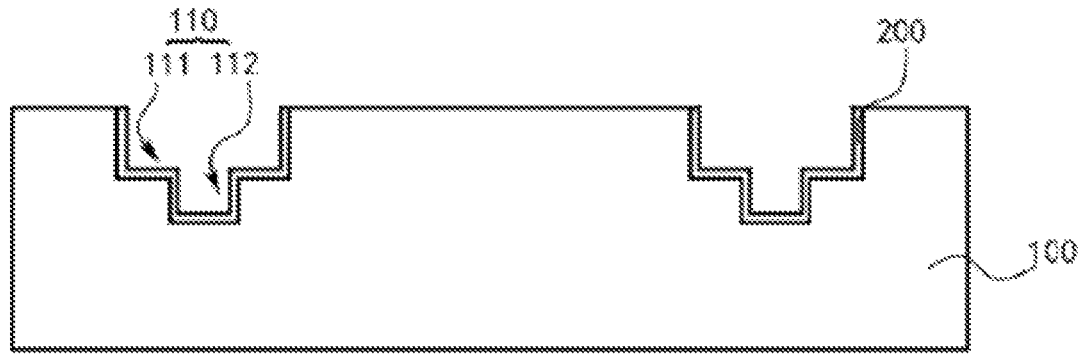
FIG. 1 to FIG. 9 are respectively schematic structural diagrams of a semiconductor structure in multiple steps of a semiconductor packaging method according to an exemplary implementation.

Exemplary implementations will be described below in further detail with reference to the accompanying drawings. However, the exemplary implementations can be implemented in various forms, and should not be construed as being limited to those described herein. On the contrary, these exemplary implementations are provided to make the present disclosure comprehensive and complete and to fully convey the concept manifested therein to persons skilled in the art. Same reference numerals in the figures indicate same or similar structures, and thus their detailed descriptions will be omitted.

Implementation 1

FIG. 1 to FIG. 10 are respectively schematic structural diagrams of examples of a semiconductor structure in multiple steps of a semiconductor packaging method proposed in the present disclosure.

As shown in FIG. 1 to FIG. 10, in this implementation, the semiconductor packaging method proposed in the present disclosure includes the following steps.

A substrate 100 is provided. The substrate may be a wafer on which a semiconductor device is formed, a to-be-packaged semiconductor chip, or the like; the wafer may be a silicon wafer, a silicon carbide wafer, a SOI wafer, a gallium arsenide wafer, a gallium carbide wafer, a gallium nitride wafer, or the like; and the semiconductor device formed on the wafer may be a storage device such as a DRAM device or a NAND device, or may be a logic device such as a CPU device.

A metal pad 400 is formed on the substrate 100, wherein there is a gap 510 between a sidewall of the metal pad 400 and the substrate 100. In an example, the metal pad 400 may be used for bonding different wafers, and the metal pad 400 may be made of a conductive metal material such as copper, aluminum, gold, silver, or the like.

Multiple metal pads 400 on substrates are connected to each other. In an example, different wafers are bonded together by connecting metal pads 400 on different substrates to each other, to increase packaging density.

The gap is formed between the sidewall of the metal pad and the substrate. This can reduce damage caused by thermal expansion of metal pads on different substrates to structures surrounding the metal pads during a bonding process, thereby achieving a better packaging effect.

Optionally, a method for forming the gap 510 includes: forming a groove 110 in the substrate 100; forming a sacrificial material layer 300 on a sidewall of the groove 110; forming the metal pad 400 in the groove 110; and removing at least a part of the sacrificial material layer 300 to form the gap 510.

Optionally, as shown in FIG. 1, the groove 110 may include a first groove 111 and a second groove 112. The second groove 112 is located below the first groove 111, and the size of an opening of the second groove 112 is smaller than that of a bottom of the first groove 111. Specifically, the first groove 111 may be an interconnection line groove in a Damascus process, the second groove 112 may be an interconnection via groove in a Damascus process, and the interconnection via groove is located below the interconnection line groove and is connected to the interconnection line groove. In a direction perpendicular to an extension direction of an interconnection line, the size of an opening of the interconnection via groove is smaller than that of a bottom of the interconnection line groove. The size of the opening may be a size of the top part of the interconnection via groove.

Figure 2:
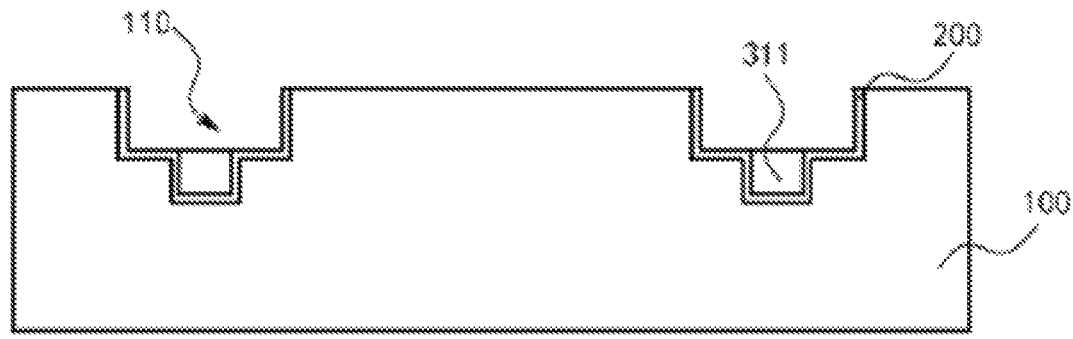
Figure 3:
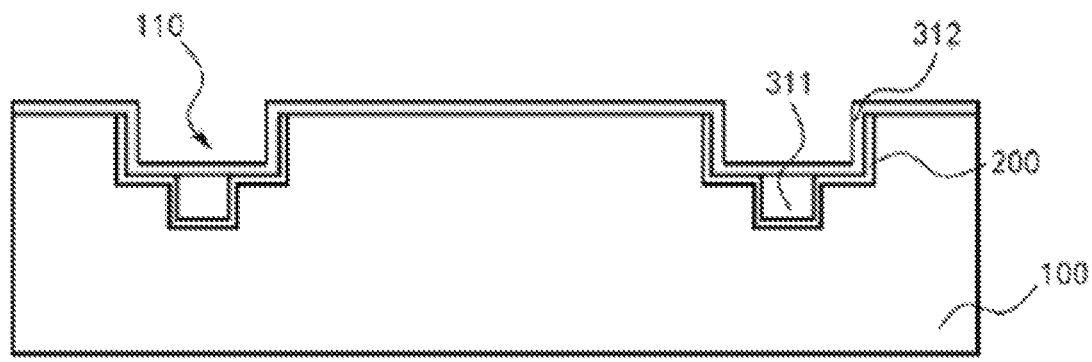
Figure 4:
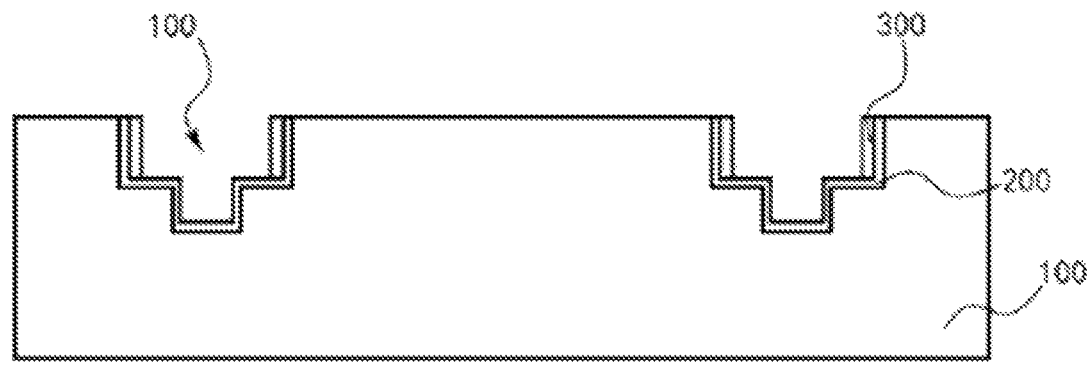
Figure 5:
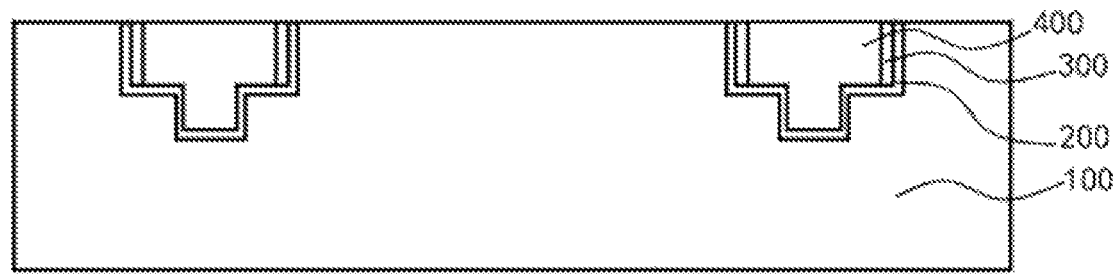
Figure 6:
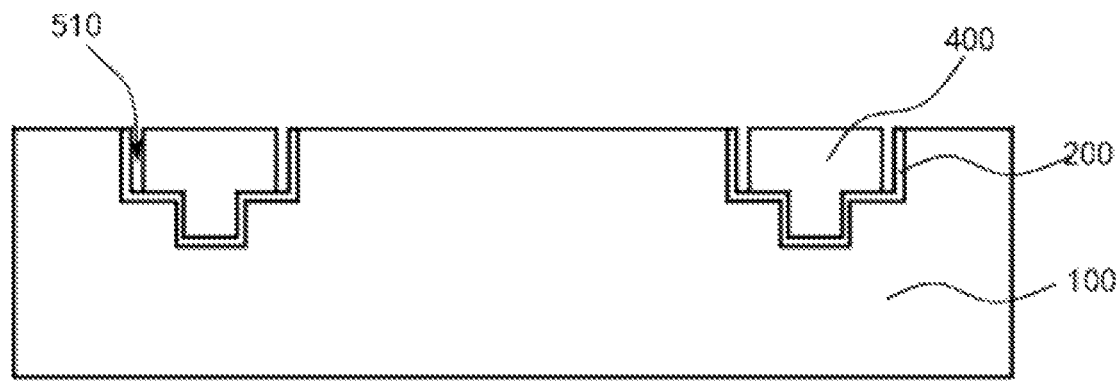

Optionally, as shown in FIG. 2 to FIG. 4, the step of forming a sacrificial material layer 300 on a sidewall of the groove 110 may include the following steps.

A first sacrificial layer 311 is filled in the second groove 112. Specifically, the first sacrificial layer 311 may be formed in the second groove 112 by using a chemical vapor deposition or spin coating process. The material of the first sacrificial layer 311 may include silicon oxide, silicon nitride, amorphous carbon, a spin-coated organic dielectric layer, or a spin-coated inorganic dielectric layer, etc. For example, the formed first sacrificial layer 311 fully fills at least the second groove 112, such that the sidewall of the second groove 112 is fully covered, ensuring that the subsequently formed sacrificial material layer 300 does not exist on the sidewall of the second groove 112. This ensures the size of an interconnection via formed in the second groove 112, and prevents an increase in contact resistance.

A second sacrificial layer 312 is formed on a surface of the substrate 100, a sidewall of the first groove 111, the bottom of the first groove 111, and a surface of the first sacrificial layer 311. Specifically, the second sacrificial layer 312 may be a material layer, that is formed by using a chemical vapor deposition or atomic layer deposition process and is different from the first sacrificial layer 311, and the material of the second sacrificial layer 312 may include silicon oxide, silicon nitride, silicon oxynitride, or silicon oxycarbide, etc.

The second sacrificial layer 312 on the surface of the substrate 100, the bottom of the first groove 111, and the surface of the first sacrificial layer 311 is removed to retain the second sacrificial layer 312 on the sidewall of the first groove 111 as the sacrificial material layer 300. Specifically, the second sacrificial layer 312 located on the surface of the substrate 100, on the bottom of the first groove 111, and on the surface of the first sacrificial layer 311 may be removed by using a dry etching process, to retain the second sacrificial layer on the sidewall of the first groove 111.

In this way, the thickness of the formed sacrificial material layer can be controllable to control characteristics of the subsequently formed gap, such as size, position, and shape, etc., such that it is possible to form a gap with corresponding characteristics based on a bonding process condition or a material, a size, or the like of the metal pad. This fully reduces damage caused by thermal expansion of metal pads on substrates to structures surrounding the metal pads during a bonding process, and ensures a bonding strength of the metal pads and the substrates, thereby achieving a better packaging effect.

Optionally, the thickness of the sacrificial material layer 300 is one-thousandth to ten-thousandth of the size of the metal pad 400 along a direction perpendicular to the sidewall of the groove. Specifically, the thickness of the sacrificial material layer 300 is the size of the sacrificial material layer along the direction perpendicular to the sidewall of the groove. When a bonding temperature of the metal pads 400 on different substrates is approximately 300° C., the gap formed by the sacrificial material layer 300 of the foregoing thickness can compensate for a size change of the metal pad 400 resulting from thermal expansion to a greatest extent.

Figure 32:
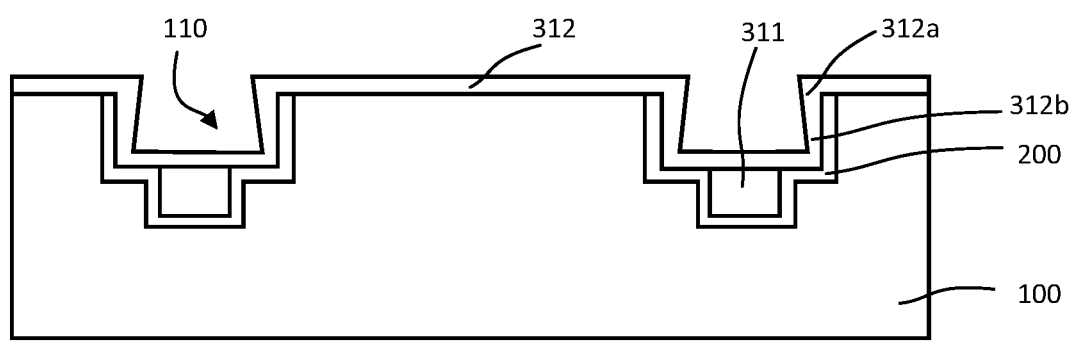
FIG. 32 is a schematic structural diagram of a sacrificial material layer formed in a semiconductor packaging method according to still another exemplary implementation.

Optionally, the thickness of the sacrificial material layer at a position close to the surface of the substrate is greater than the thickness of the sacrificial material layer at a position away from the surface of the substrate. As shown in FIG. 32, the thickness of the second sacrificial layer 312 at the position 312a close to the surface of the substrate 100 is greater than the thickness of the second sacrificial layer 312 at the position 312b away from the surface of the substrate 100. It should be understood that "close to" and "away from" are relative, and do not constitute limitations on specific positions. The gap formed by the sacrificial material layer with the foregoing morphology may well match an actual change of the metal pad 400 during bonding. During bonding of the metal pad 400, larger space is required near the contact surface between different metal pads 400 to accommodate an expanded portion. Specifically, the sacrificial material layer includes any one of silicon oxide, silicon nitride, silicon oxynitride, or silicon oxycarbide; the silicon oxide, the silicon nitride, the silicon oxynitride, and the silicon oxycarbide, the sacrificial material layer is formed by plasma enhanced chemical vapor deposition (PECVD). The PECVD is performed at the temperature of 100-200° C., and the pressure of 10-30 Torr. The morphology of the sacrificial material layer formed under the conditions may well satisfy the requirements.

Optionally, before forming the first sacrificial layer 311 and the second sacrificial layer 312, the method further includes: forming a barrier layer 200 on sidewalls and bottoms of the first groove 111 and the second groove 112. As shown in FIG. 1, the barrier layer 200 is formed on the bottoms and the sidewalls of the first groove 111 and the second groove 112 by using an ALD process or other deposition process. The material of the barrier layer 200 may include titanium nitride (TiN). In another implementation, the material of the barrier layer 200 may alternatively include titanium (Ti), tantalum (Ta), tantalum nitride (TaN), ruthenium (Ru), rhenium (Re), conductive metal nitride, or the like. This is not limited to this implementation.

Figure 10:
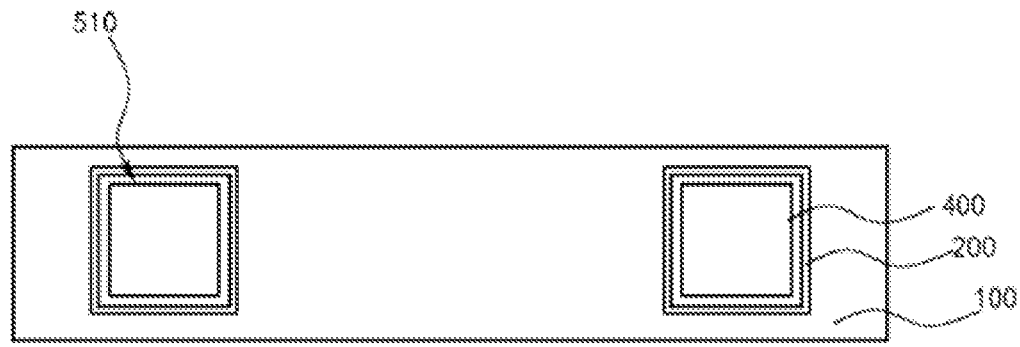
FIG. 10 is a top view of FIG. 6.
Figure 11:
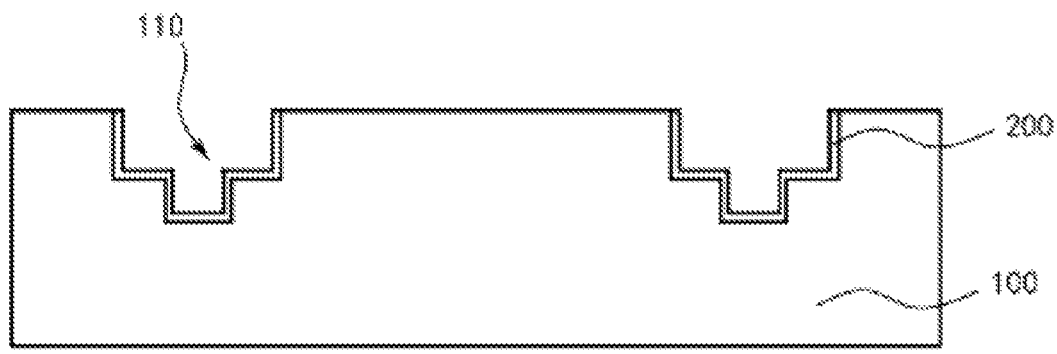
FIG. 11 to FIG. 18 are respectively schematic structural diagrams of a semiconductor structure in multiple steps of a semiconductor packaging method according to another exemplary implementation.

Optionally, the step of removing at least a part of the sacrificial material layer to form the gap includes:

removing at least a part of the sacrificial material layer by dry etching, wet etching, or chemical mechanical polishing (CMP). Specifically, the sacrificial material layer may be removed by dry etching or wet etching by using an etching selection ratio between the metal pad and the sacrificial material layer, and an etching degree may be controlled by time control or by using an etching end-point, to control the size of the formed gap. In an example, as shown in FIG. 10, which is a top view of FIG. 6, the gap 510 surrounds the metal pad 400, and separates an upper part of the metal pad 400 that is close to the surface of the substrate 100 from the substrate. In this example, the cross-sectional profile of the groove 110 in a direction along the surface of the substrate 100 is in a square shape. In another example, the cross-sectional profile of the groove 110 in a direction along the surface of the substrate 100 is in a sawtooth shape, such that the cross-sectional profile of the formed gap 510 in the direction along the surface of the substrate 100 is also in a sawtooth shape. This achieves an effect of releasing stress and reduces damage caused by the metal pad 400 to the structure surrounding the metal pad 400.

Figure 7:
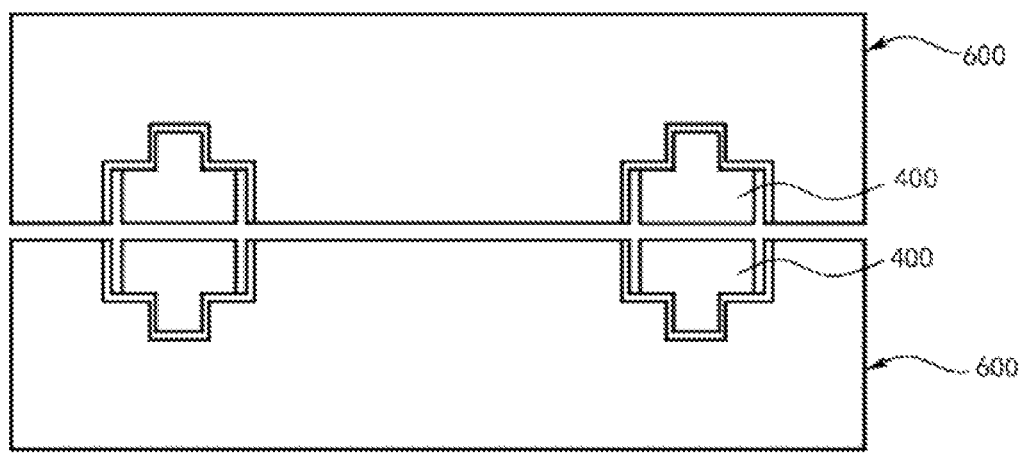
Figure 8:
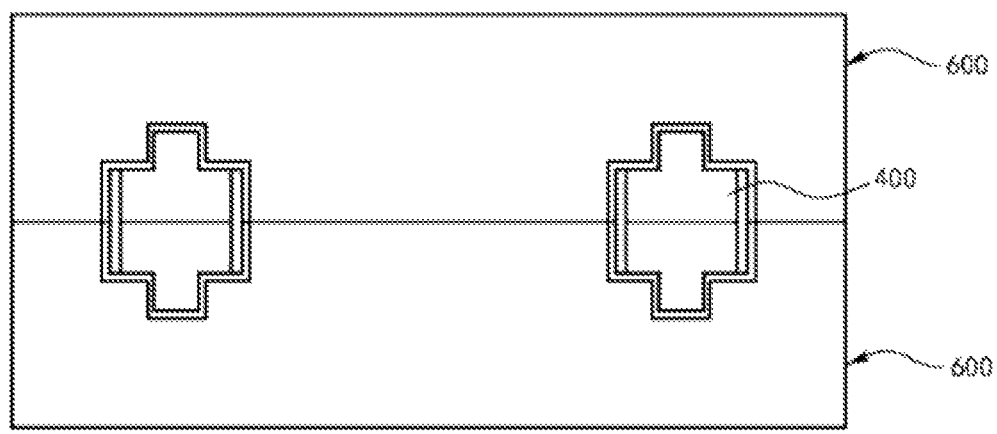
Figure 9:
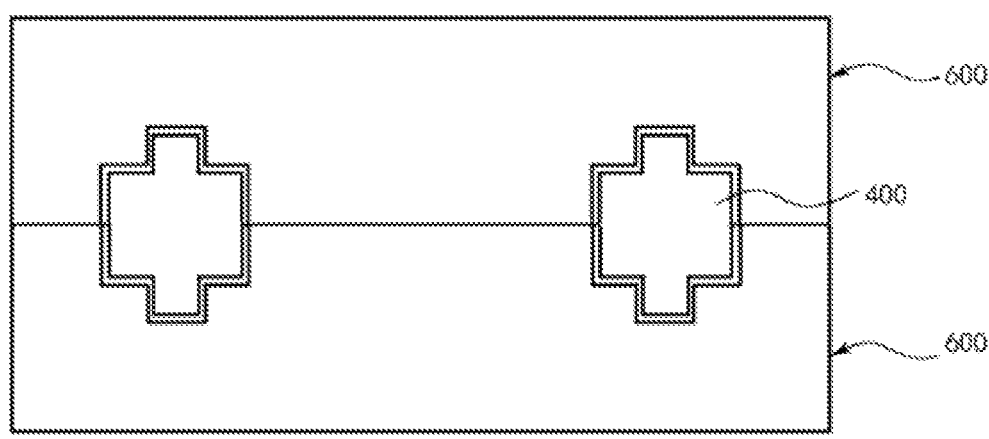

Optionally, as shown in FIG. 7 to FIG. 9, bonding two substrates 600, each substrate with a gap and a metal pad 400, may include the following steps:
- aligning the substrates 600 each provided with a gap and a metal pad 400;
- performing pre-bonding, for example, fusion bonding or the like, on the metal pads 400 on the substrates 600; and
- performing annealing treatment on the bonded metal pads 400, such that the metal pad 400 expand to fill the gap 510.

Figure 29:
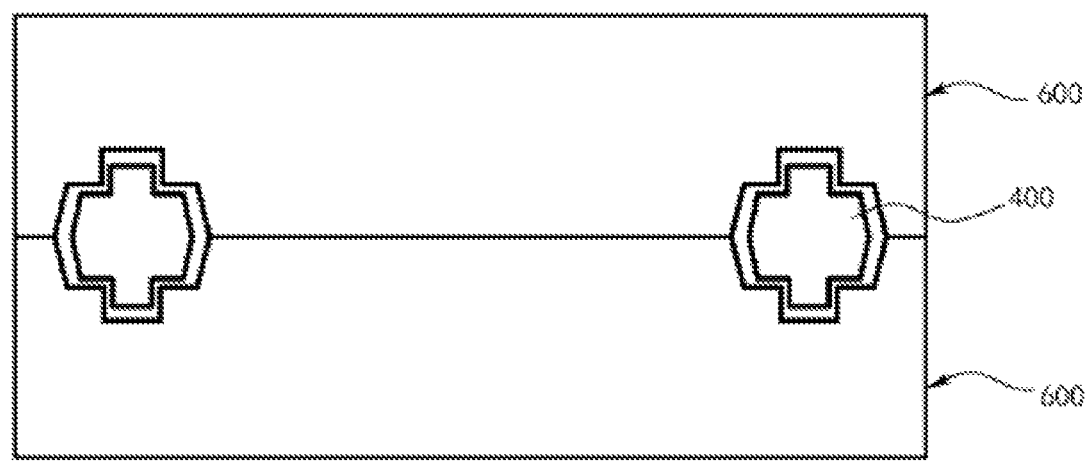
FIG. 29 to FIG. 31 are respectively schematic structural diagrams of a semiconductor structure formed by using the semiconductor packaging method according to three exemplary implementations.

Optionally, in the step of forming the groove 110, a longitudinal cross-section of the groove 110 may be set to be in a roughly trapezoidal shape, and a semiconductor structure obtained after bonding is roughly shown in FIG. 29. According to the foregoing design, the bonding area of the metal pads 400 can be further increased, so as to reduce a contact resistance.

Implementation 2

Based on the foregoing detailed description of the exemplary implementation of the semiconductor packaging method proposed in the present disclosure, another exemplary implementation of the semiconductor packaging method proposed in the present disclosure is described below with reference to FIG. 11 to FIG. 19. A part of the process in this implementation that is substantially the same as the related process in the foregoing first implementation is not described herein again.

Figure 12:
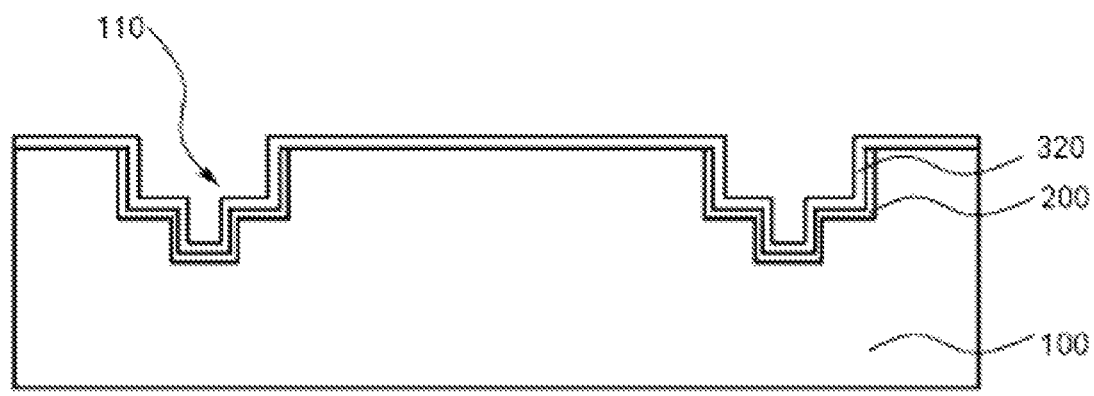
Figure 13:
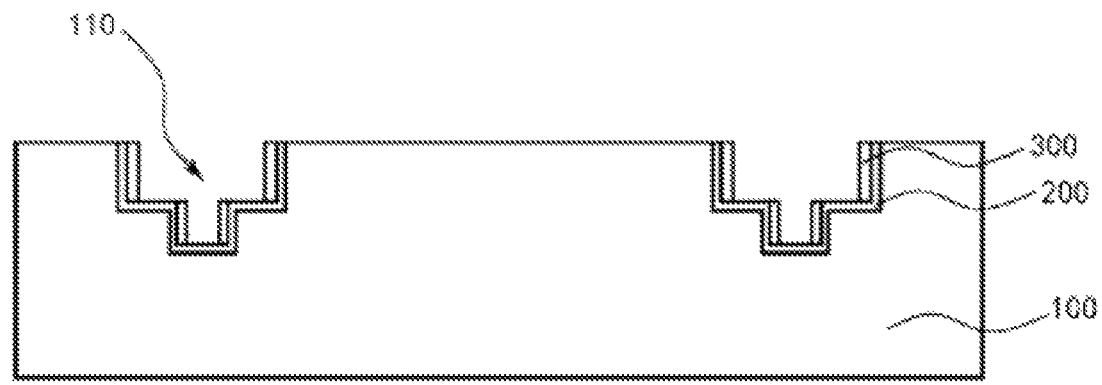
Figure 14:
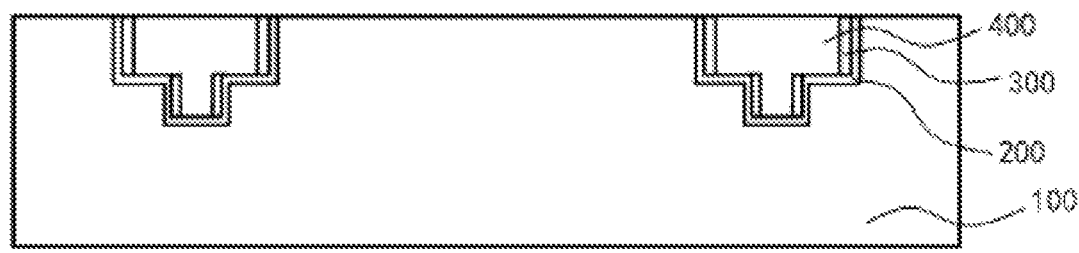

Optionally, as shown in FIG. 12 and FIG. 13, in this implementation, the step of forming a sacrificial material layer 300 on a sidewall of the groove 110 may include the following steps.

A metal layer 320 is formed on the surface of the substrate 100, the bottom and a sidewall of the first groove, and the bottom and a sidewall of the second groove.

The metal layer 320 on the surface of the substrate 100, the bottom of the first groove, and the bottom of the second groove is removed to retain the metal layer 320 on the sidewall of the first groove and the sidewall of the second groove as the sacrificial material layer 300.

According to the foregoing method, the fabrication process for forming the sacrificial material layer 300 is simplified, without increasing a contact resistance of an interconnection via formed in the second groove.

Figure 33:
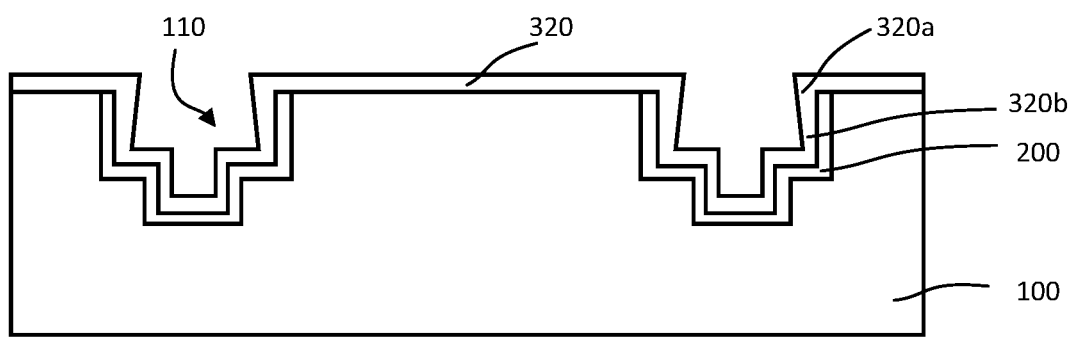
FIG. 33 is a schematic structural diagram of a sacrificial material layer formed in a semiconductor packaging method according to still another exemplary implementation.

Optionally, the metal layer 320 is formed by using a physical vapor deposition (PVD) process, and the PVD is performed at a temperature of 50-350° C., a flow rate of inert gas of 100-450 sccm, and a pressure of the inert gas of 0.1-10 Torr. As shown in FIG. 33, the thickness of the material layer 300 formed by using the foregoing process is greater at a position 320a close to the surface of the substrate 100 than at a position 320b away from the surface of the substrate 100. It should be understood that "close to" and "away from" are relative, and do not constitute limitations on specific positions.

Optionally, the material of the metal pad 400 includes copper, and the material of the metal layer 320 includes nickel, zinc, aluminum, silver, or gold.

Figure 15:
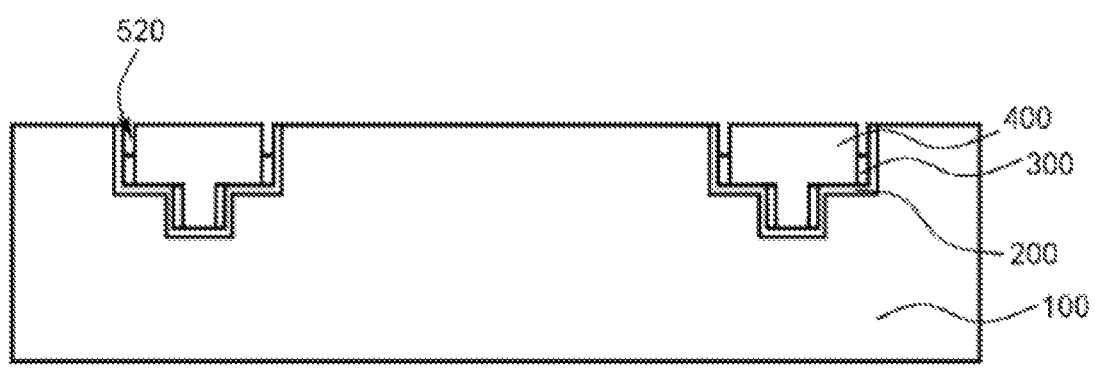
Figure 19:
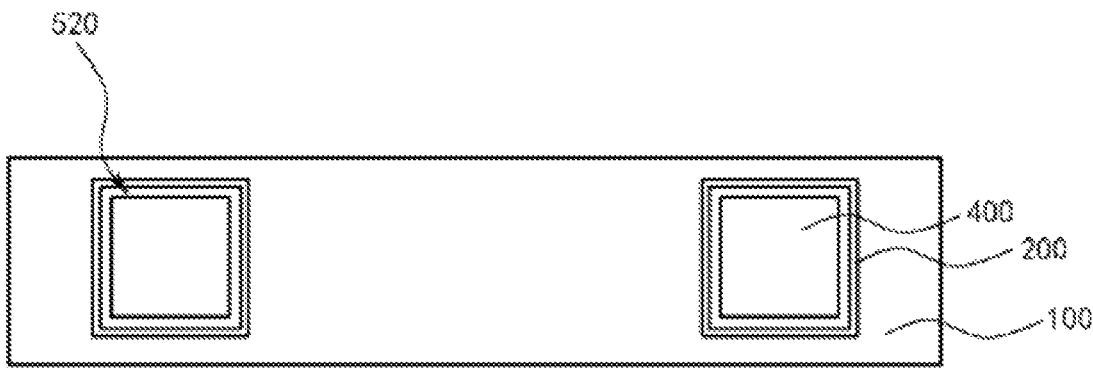
FIG. 19 is a top view of FIG. 15.
Figure 20:
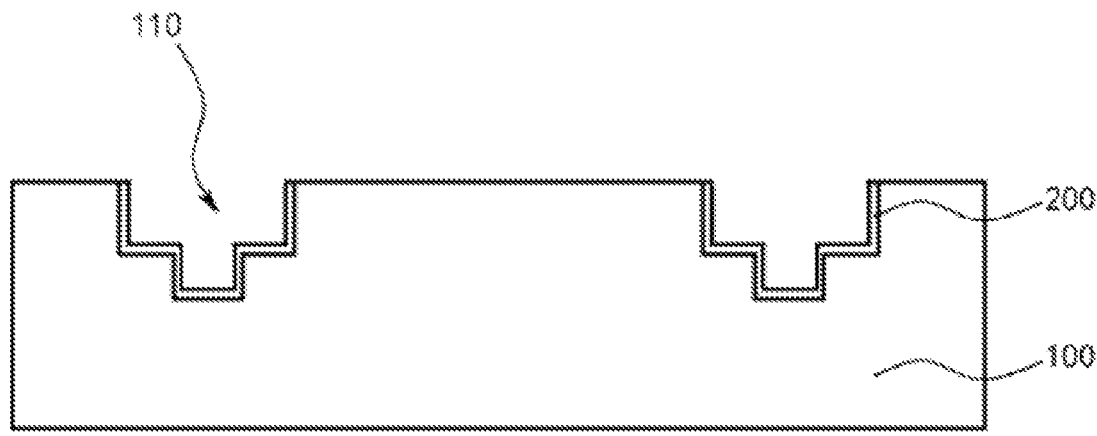
FIG. 20 to FIG. 27 are respectively schematic structural diagrams of a semiconductor structure in multiple steps of a semiconductor packaging method according to still another exemplary implementation.

Optionally, the ratio of the length of the gap 520 in a direction along the sidewall of the first groove to the length of the sidewall of the first groove is 0.1-0.5, for example, 0.1, 0.3, 0.4, and 0.5. FIG. 15 shows the substrate 100, the groove 110, a barrier layer 200, the sacrificial material layer 300, the metal pad 400, and the gap 520 in the semiconductor structure. The gap 520 is formed by removing a part of the sacrificial material layer 300, or in other words, the gap 520 is formed by a channel between a sidewall of the metal pad 400, the sidewall of the groove 110, and the remaining sacrificial material layer 300. FIG. 19 shows an example of a top view of FIG. 15. It can be seen that the gap 520 surrounds the metal pad 400.

Figure 16:
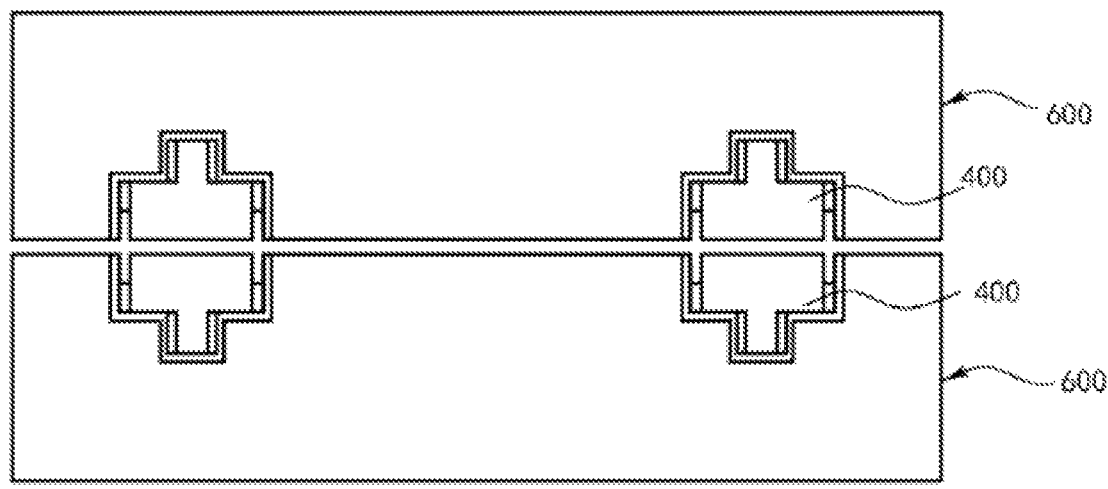
Figure 17:
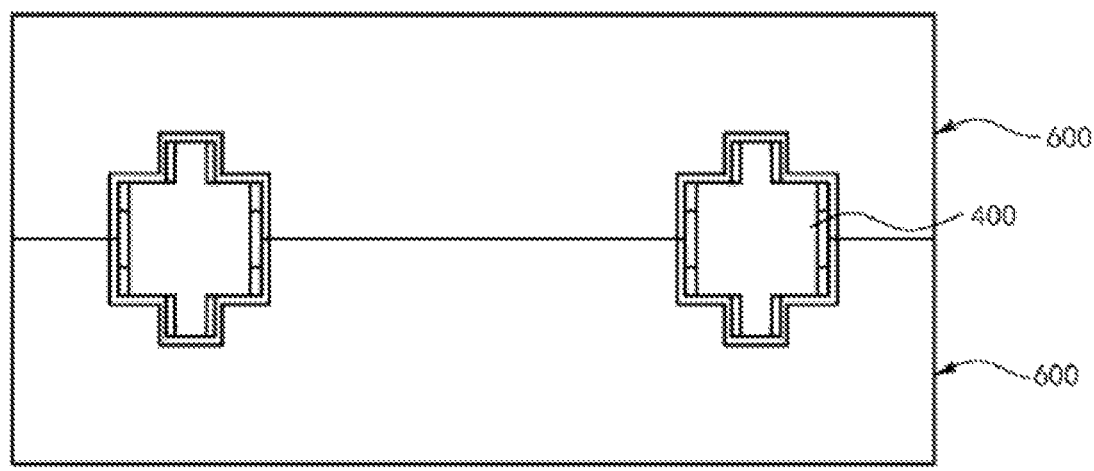
Figure 18:
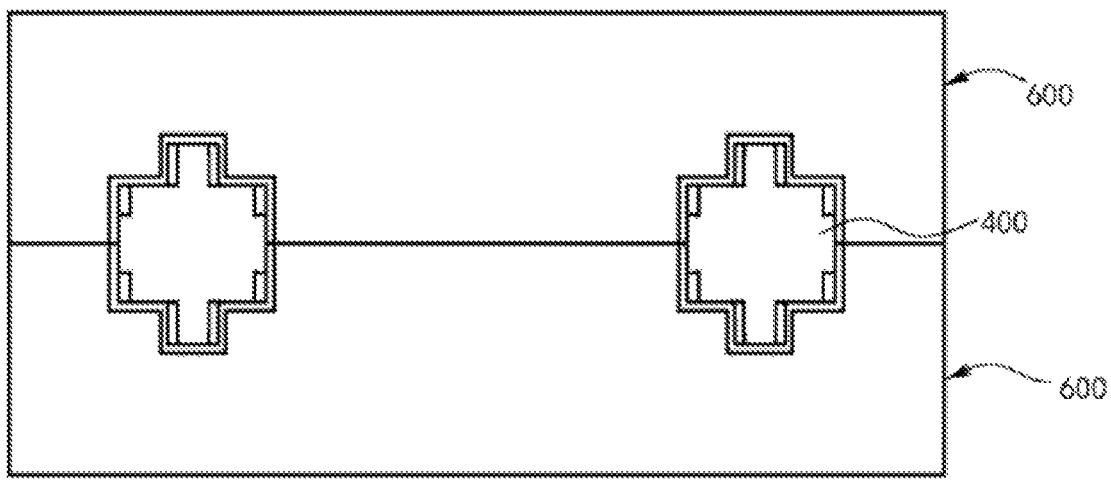

FIG. 16 to FIG. 18 are schematic structural diagrams of a semiconductor structure in several steps of "bonding two substrates 600". The process of bonding the two substrates 600 in this implementation is roughly the same as the related process in the foregoing first implementation, and details are not described herein again.

Figure 30:
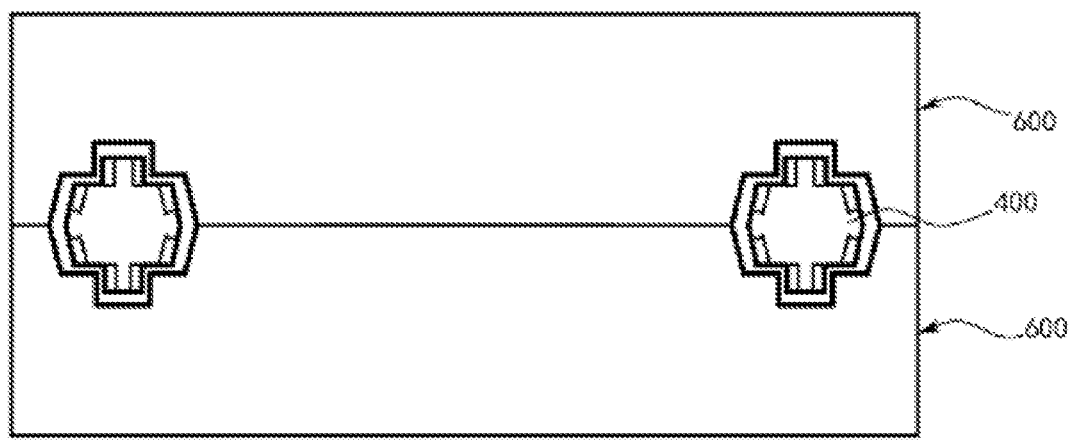

In addition, based on the foregoing design in the implementation shown in FIG. 11 to FIG. 19, in another implementation, in the step of forming the groove, a longitudinal cross-section of the groove may be set to be in a roughly trapezoidal shape, and a semiconductor structure obtained after bonding is roughly shown in FIG. 30. According to the foregoing design, the bonding area of the metal pad 400 can be further increased, so as to reduce a contact resistance.

Implementation 3

Based on the foregoing detailed description of the two exemplary implementations of the semiconductor packaging method proposed in the present disclosure, still another exemplary implementation of the semiconductor packaging method proposed in the present disclosure is described below with reference to FIG. 20 to FIG. 28. A part of the process in this implementation that is substantially the same as the related process in the foregoing first implementation and/or second embodiment is not described herein again.

Figure 21:
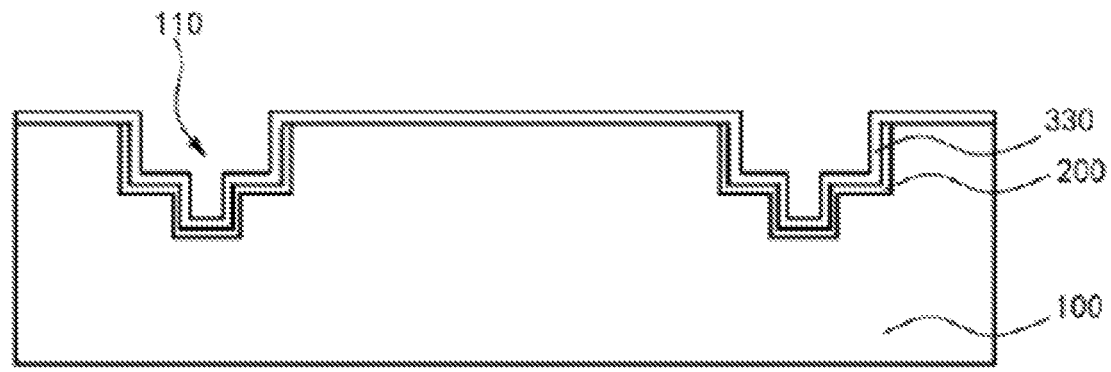
Figure 22:
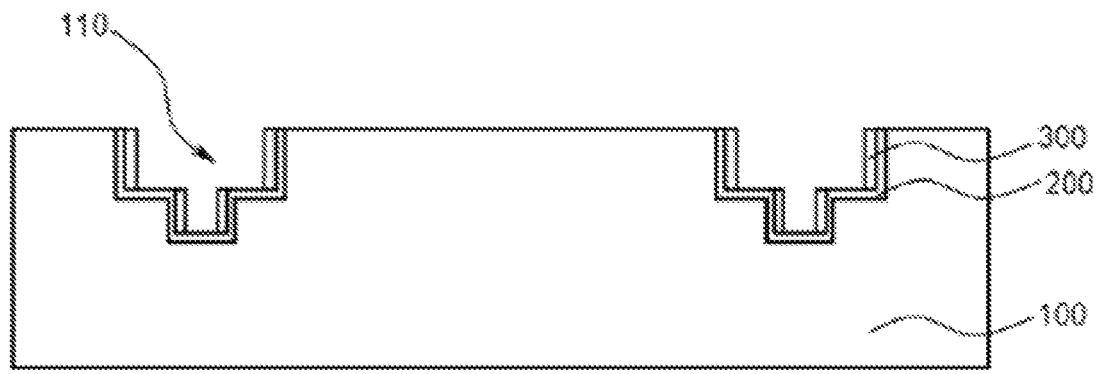
Figure 23:
Figure 24:
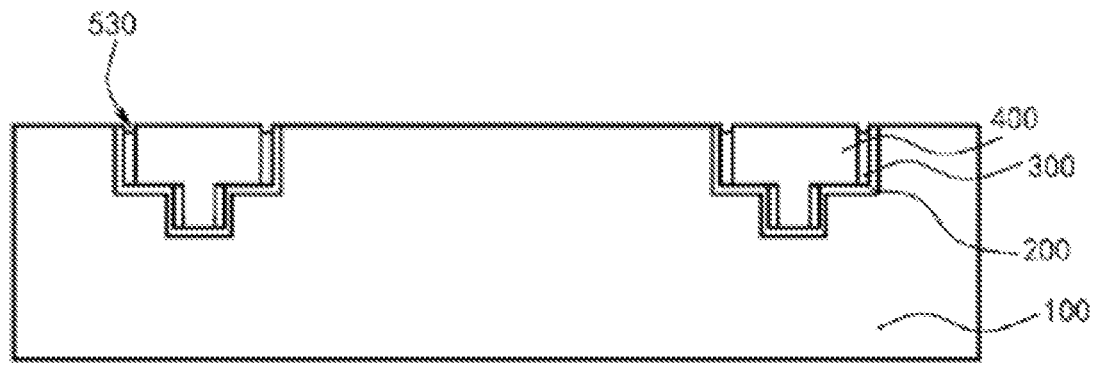

Optionally, as shown in FIG. 21 and FIG. 24, the step of removing at least a part of the sacrificial material layer 300 to form a gap 530 includes the following steps:

A metal layer 330 is formed on the surface of the substrate 100, the bottom and the sidewall of the first groove, and the bottom and a sidewall of the second groove, and a part of the metal layer 330 on the surface of the substrate 100, the bottom of the first groove, and the bottom of the second groove is removed to retain the metal layer 330 on the sidewall of the first groove as the sacrificial material layer 300.

A metal pad 400 is formed in the groove 110.

Figure 28:
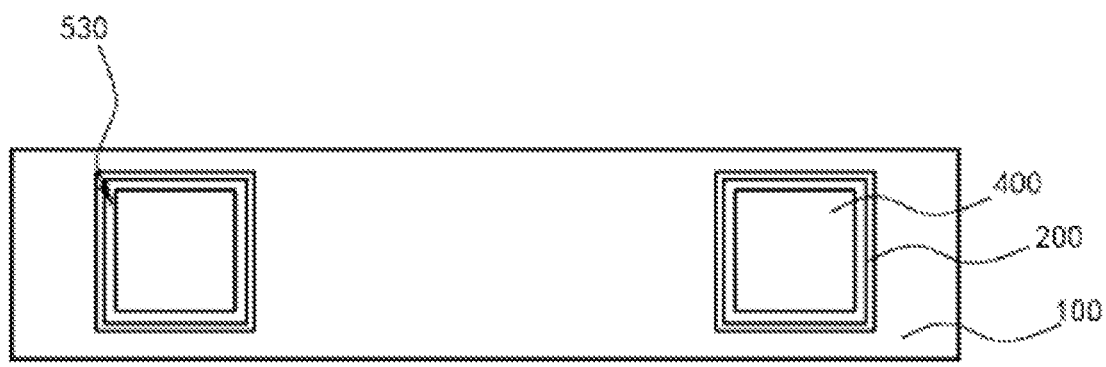
FIG. 28 is a top view of FIG. 24.

A part of the sacrificial material layer 300 on the surface of the substrate 100 and the sidewall of the first groove is removed by CMP to form the gap 530. The thermal expansion coefficient of the sacrificial material layer 300 is different from the thermal expansion coefficient of the metal pad 400, to prevent the remaining sacrificial material layer on the sidewall of the first groove from causing damage to the structure surrounding the metal pad due to thermal expansion in the bonding process of the metal pad. For example, the thermal expansion coefficient of the sacrificial material layer 300 is less than that of the metal pad 400. Further, based on the foregoing design of the process of forming the sacrificial material layer 300, in this implementation, in the case where the material of the metal pad 400 includes copper (Cu), the material of the sacrificial material layer 300 may include magnesium (Mg). In another implementation, the material of the sacrificial material layer 300 may alternatively include another material, such as zinc (Zn), silver (Ag), aluminum (Al), or gold (Au). No limitation is set to this implementation. In this implementation, a process condition of chemical mechanical polishing, such as the type of polishing liquid, is adjusted to selectively increase the polishing rate of the sacrificial material layer 300 to form the gap 530. FIG. 28 shows an example of a top view of FIG. 24. It can be seen that the gap 530 surrounds the metal pad 400.

Optionally, the ratio of the length of the gap 530 in a direction along the sidewall of the first groove to the length of the sidewall of the first groove is 0.01-0.1. For example, in this implementation, the ratio of the depth of the gap 530 formed by chemical mechanical polishing to the groove depth of the first groove may be 0.01-0.1, for example, 0.01, 0.04, 0.07, or 0.1. Based on the foregoing process design in this implementation, in another implementation, the ratio may alternatively be less than 0.01 or greater than 0.1, for example, 0.008 or 0.11. No limitation is set to this implementation.

Figure 25:
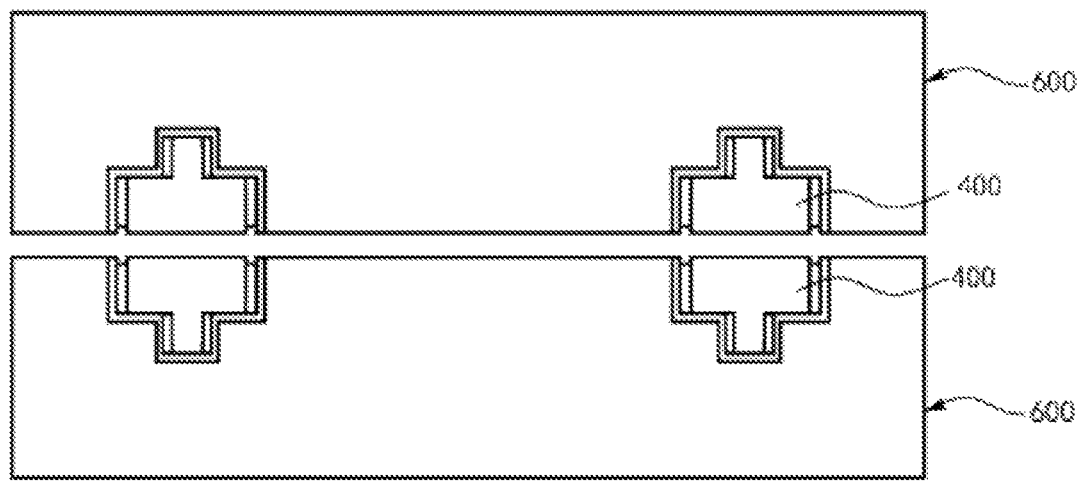
Figure 26:
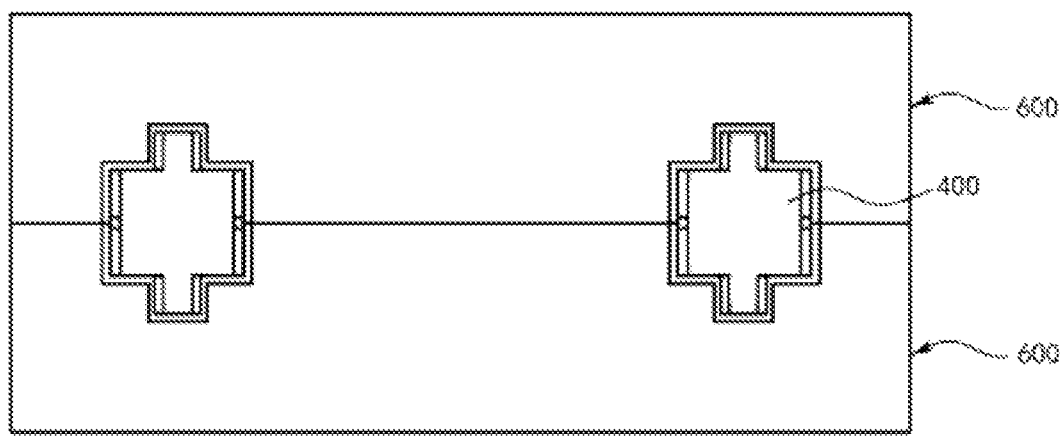
Figure 27:
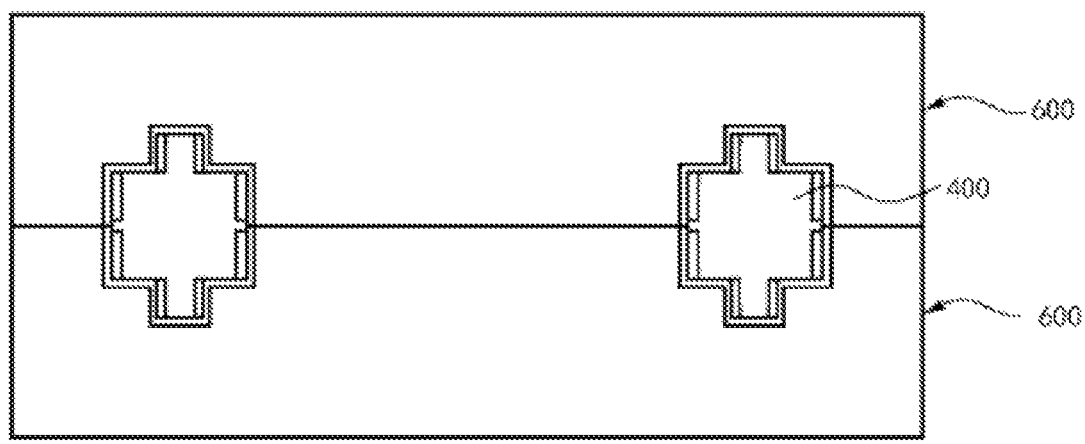

FIG. 25 to FIG. 27 are schematic structural diagrams of a semiconductor structure in several steps of "bonding two substrates 600". The process of bonding the two substrates 600 in this implementation is roughly the same as the related processes in the foregoing first implementation and second implementation, and details are not described herein again.

Figure 31:
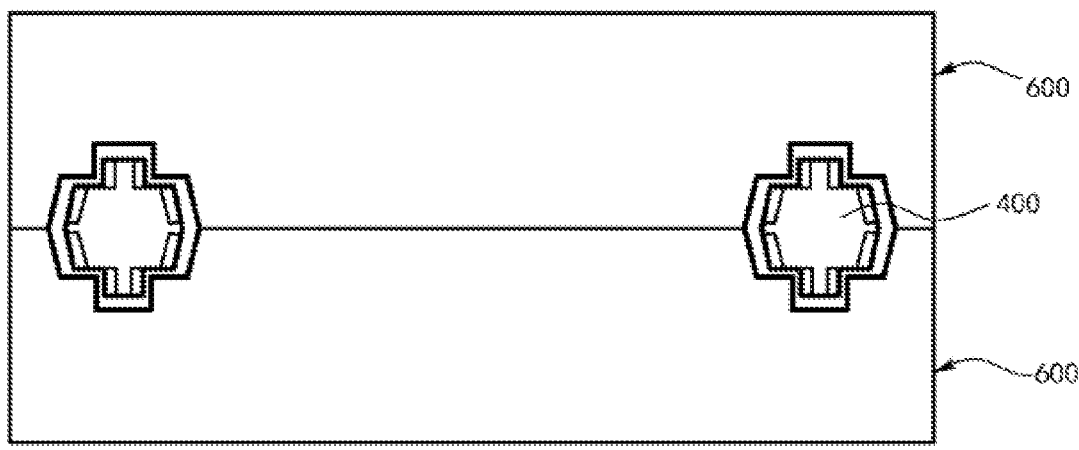

In addition, based on the foregoing design in the implementation shown in FIG. 20 to FIG. 28, in another implementation, in the step of forming the groove 110, a longitudinal cross-section of the groove 110 may be set to be in a roughly trapezoidal shape, and a semiconductor structure obtained after bonding is roughly shown in FIG. 31. According to the foregoing design, the bonding area of the metal pad 400 can be further increased, so as to reduce a contact resistance.

Based on the foregoing detailed description of the multiple exemplary implementations of the semiconductor packaging method proposed in the present disclosure, an exemplary implementation of a semiconductor structure proposed in the present disclosure is described. The semiconductor structure in this embodiment may be fabricated by using the foregoing semiconductor packaging method that is proposed in the present disclosure and described in detail in the foregoing implementations.

As shown in FIG. 1 to FIG. 6, the semiconductor structure proposed in the present disclosure includes: a substrate 100 provided with a groove 110; a metal pad 400 located in the groove 110; and a gap 510, wherein at least a part of the gap 510 is located on a sidewall of the groove 110 and at least partially separates the metal pad 400 from the substrate 100.

Optionally, the width of an upper part of the gap 510 is greater than that of a lower part of the gap.

Optionally, the cross-sectional profile of the groove 110 in a direction along the surface of the substrate 100 is in a sawtooth shape.

Optionally, the groove 110 includes a first groove 111 and a second groove 112, the second groove 112 is located at the bottom of the first groove 111, and the size of an opening of the second groove 112 is smaller than that of a bottom of the first groove 111.

Optionally, at least a part of the gap 510 is located above the sidewall of the first groove 111.

In conclusion, according to the semiconductor packaging method provided in the embodiments of the present disclosure, the sacrificial material layer is formed on the sidewall of the groove on the substrate, and after a conductive layer is formed, at least a part of the sacrificial material layer is removed to form the gap surrounding the conductive layer. According to the foregoing design, the semiconductor packaging method proposed in the embodiments of the present disclosure can implement a more controllable gap formation process, and reduce stress exerted by the metal pad formed of the conductive layer on the structure surrounding the metal pad during expansion in a subsequent fabrication process, thereby achieving a better packaging effect.

Although the present disclosure is described above with reference to several typical embodiments, it should be understood that the terms used herein are intended for illustration, rather than limiting. The present disclosure may be specifically implemented in many forms without departing from the spirit or essence of the present disclosure. Therefore, it should be understood that the above embodiments are not limited to any of the above-mentioned details, but should be broadly interpreted according to the spirit and scope defined by the appended claims. Therefore, any changes and modifications falling within the claims or the equivalent scope thereof should be covered by the appended claims.

The invention claimed is:

1. A semiconductor packaging method, comprising:
    providing a substrate;
    forming a metal pad on the substrate, wherein there is a gap between a sidewall of the metal pad and the substrate; and
    connecting multiple metal pads on substrates to each other;
    wherein a method for forming the gap comprises:
    forming a groove in the substrate;
    forming a sacrificial material layer on a sidewall of the groove;
    forming the metal pad in the groove; and
    removing at least a part of the sacrificial material layer to form the gap.

2. The semiconductor packaging method according to claim 1, wherein
    a thickness of the sacrificial material layer at a position close to a surface of the substrate is greater than a thickness of the sacrificial material layer at a position away from the surface of the substrate.

3. The semiconductor packaging method according to claim 2, wherein
    the sacrificial material layer comprises any one of silicon oxide, silicon nitride, silicon oxynitride, or silicon oxycarbide;
    the sacrificial material layer is formed by plasma enhanced chemical vapor deposition (PECVD); and
    the PECVD is performed at a temperature of 100-200° C., and a pressure of 10-30 Torr.

4. The semiconductor packaging method according to claim 2, wherein
    the sacrificial material layer comprises a metal material layer formed by physical vapor deposition (PVD); and
    the PVD is performed at a temperature of 50-350° C., a flow rate of inert gas of 100-450 sccm, and a pressure of the inert gas of 0.1-10 Torr.

5. The semiconductor packaging method according to claim 1, wherein
    a thickness of the sacrificial material layer is one-thousandth to ten-thousandth of a size of the metal pad along a direction perpendicular to the sidewall of the groove.

6. The semiconductor packaging method according to claim 1, wherein the step of removing at least a part of the sacrificial material layer to form the gap comprises:
    removing at least a part of the sacrificial material layer by dry etching, wet etching, or chemical mechanical polishing (CMP).

7. The semiconductor packaging method according to claim 1, wherein the groove comprises a first groove and a second groove, the second groove is located below the first groove, and a size of an opening of the second groove is smaller than a size of a bottom of the first groove.

8. The semiconductor packaging method according to claim 7, wherein the step of forming the sacrificial material layer on the sidewall of the groove comprises:
filling a first sacrificial layer in the second groove;
forming a second sacrificial layer on the surface of the substrate, a sidewall of the first groove, the bottom of the first groove, and a surface of the first sacrificial layer; and
removing a part of the second sacrificial layer which is on the surface of the substrate, on the bottom of the first groove, and on the surface of the first sacrificial layer, to retain the second sacrificial layer on the sidewall of the first groove as the sacrificial material layer.

9. The semiconductor packaging method according to claim 7, wherein the step of forming the sacrificial material layer on the sidewall of the groove comprises:
forming a metal layer on the surface of the substrate, the bottom and a sidewall of the first groove, and a bottom and a sidewall of the second groove; and
removing the metal layer on the surface of the substrate, the bottom of the first groove, and the bottom of the second groove, to retain the metal layer on the sidewall of the first groove and the sidewall of the second groove as the sacrificial material layer.

10. The semiconductor packaging method according to claim 9, wherein a material of the metal pad comprises copper; and
a material of the metal layer comprises nickel, zinc, aluminum, silver, or gold.

11. The semiconductor packaging method according to claim 9, wherein a ratio of a length of the gap in a direction along the sidewall of the first groove to a length of the sidewall of the first groove is 0.1-0.5.

12. The semiconductor packaging method according to claim 7, wherein the step of removing at least a part of the sacrificial material layer to form the gap comprises:
forming a metal layer on the surface of the substrate, the bottom and a sidewall of the first groove, and a bottom and a sidewall of the second groove;
forming the metal pad in the groove; and
removing a part of the metal layer on the surface of the substrate, and the sidewall of the first groove by CMP, to form the gap; wherein a thermal expansion coefficient of the metal layer is different from a thermal expansion coefficient of the metal pad.

13. The semiconductor packaging method according to claim 12, wherein a material of the metal pad comprises copper; and
a material of the metal layer comprises magnesium, zinc, silver, aluminum, or gold.

14. The semiconductor packaging method according to claim 12, wherein a ratio of a length of the gap in a direction along the sidewall of the first groove to a length of the sidewall of the first groove is 0.01-0.1.

15. A semiconductor structure, comprising:
a substrate with a groove;
a metal pad located in the groove; and
a gap, wherein at least a part of the gap is located on a sidewall of the groove, the gap at least partially separates the metal pad from the substrate, and a width of an upper part of the gap is greater than a width of a lower part of the gap.

16. The semiconductor structure according to claim 15, wherein
the groove comprises a first groove and a second groove, the second groove is located at a bottom of the first groove, and a size of an opening of the second groove is smaller than a size of the bottom of the first groove.

17. The semiconductor structure according to claim 16, wherein
at least a part of the gap is located above a sidewall of the first groove.

* * * * *